United States Patent [19]

Bahout et al.

[11] Patent Number: 5,742,548
[45] Date of Patent: Apr. 21, 1998

[54] ELECTRICALLY MODIFIABLE NON-VOLATILE MEMORY WITH WRITE CHECKING

[75] Inventors: Yvon Bahout, Fuveau; François Tailliet, Epinay Sur Seine, both of France

[73] Assignee: SGS-Thomson Microelectronics, S.A., Gentilly, France

[21] Appl. No.: 340,940

[22] Filed: Nov. 17, 1994

[30] Foreign Application Priority Data

Nov. 23, 1993 [FR] France .................. 93 14211

[51] Int. Cl.$^6$ .................................. G11C 7/00
[52] U.S. Cl. ............ 365/201; 365/189.01; 365/189.07
[58] Field of Search ................ 365/201, 189.01, 365/189.07, 230.06, 189.09, 210

[56] References Cited

U.S. PATENT DOCUMENTS

| | | | |
|---|---|---|---|
| 4,279,024 | 7/1981 | Schrenk | 365/203 |
| 4,357,685 | 11/1982 | Daniele et al. | 365/189 |
| 5,325,337 | 6/1994 | Buttar | 365/210 |
| 5,426,609 | 6/1995 | Okuda | 365/201 |
| 5,453,954 | 9/1995 | Nakamura | 365/201 |
| 5,471,428 | 11/1995 | Baron et al. | 365/210 X |
| 5,487,042 | 1/1996 | Edo | 365/201 |
| 5,491,662 | 2/1996 | Pezzini | 365/201 X |

FOREIGN PATENT DOCUMENTS

0231041A1  5/1989  European Pat. Off. .

*Primary Examiner*—Do Hyun Yoo
*Attorney, Agent, or Firm*—Robert Groover; Betty Formby; Matthew Anderson

[57] ABSTRACT

In order to make it possible to ascertain that the programming cycles in an EEPROM type memory have been carried out efficiently, supplementary test cells are provided. A data writing operation is carried out in three successive cycles that consist in the programming of a test cell with a first logic value, a second cycle for the programming of the data elements and a third cycle for the programming of the test cell with a logic value that is complementary to the first one. The state of the test cell enables the detection of power interruptions during programming.

20 Claims, 1 Drawing Sheet

5,742,548

ELECTRICALLY MODIFIABLE NON-VOLATILE MEMORY WITH WRITE CHECKING

CROSS-REFERENCE TO RELATED APPLICATION

This application claims priority from French App'n 93-14211, filed Nov. 23, 1993, which is hereby incorporated by reference. However, the content of the present application is not necessarily identical to that of the priority application.

BACKGROUND AND SUMMARY OF THE INVENTION

The invention relates to an electrically modifiable non-volatile memory comprising means to ascertain that the write operations have been performed efficiently.

This type of memory, which is commonly called an EEPROM, is made in the form of an integrated circuit, and includes a set of memory cells, means to select these cells, and programming means. The integrated circuit communicates with the exterior by means of an interface circuit designed to receive the read and write commands associated with address information elements, receive the data elements to be written, and deliver the data elements that are read. The unit is controlled by a control circuit that is sensitive to the command signals received from the interface.

The programming means is formed by a programming signal generator, called a "high voltage" generator, capable of charging or discharging the floating gates of transistors that form the memory cells. In response to a write command, the control circuit selects the transistors to be programmed as a function of the address received and activates the programming signal generator. This set of operations is called a programming cycle. In certain embodiments, the writing of data elements may call for two successive programming cycles: the first cycle consists in resetting all the cells of the words to be written to zero, and the second cycle consists in setting selected cells of the word to one.

In order for the memory to be properly programmed, it is necessary that the high voltage generator give a voltage pulse that is well calibrated in terms of level and duration. If not, there is a risk that the floating gates of the transistors might be incompletely charged or discharged. This may prompt a gradual erasure of the recorded data elements. This problem arises especially when there is a disturbance or a cut in the supply voltage of the integrated circuit during a programming cycle.

Hence, the invention seeks to resolve the problem of ascertaining that the programming cycles are being carried out properly and that the operations for programming EEPROM type memories are performed efficiently. To this end, an object of the invention is an electrically modifiable non-volatile memory comprising a set of memory cells, means for the addressing and programming of the cells, and an interface circuit, the memory being controlled by a control circuit, wherein said memory comprises at least one additional memory cell hereinafter called a test cell, said control circuit comprises means for the selective activation of the programming of said test cell and, in response to any write command received by said interface circuit, the control circuit activates three successive programming cycles:

a first cycle for the programming of a test cell to write a first determined binary logic value;

a second cycle for the programming of the data elements to be written; and a third cycle for the programming of said test cell to write a second logic value that is complementary to the first one.

This approach makes use of the fact that the three cycles can normally not be disassociated and that an interruption, be it even a momentary interruption, of the supply leads to a permanent interruption of the following programming cycles. Indeed, an interruption of the supply of the integrated circuit prompts the erasure of all the volatile information elements of the circuit, especially the addresses and the status variables that condition the sequencing of the programming cycles. The reading of the test cell therefore gives the following information elements:

if the cell is in its initial state (for example at zero), all that can be deduced therefrom is either that the three cycles have taken place normally or that none of the three cycles has begun;

if the cell is in its complementary state (for example at one), it is known with certitude that a disturbance has taken place during the second or third cycle and hence that the programming is not sure.

The simplest way to implement the invention consists in using only one test cell for the entire memory.

The existence of the test cell could be used in different ways. In a first variant, the interface circuit communicates with the test cell to give a test signal that represents the state of the test cell. This arrangement therefore makes it possible to check the quality of the programming of the last memorized word.

According to another alternative embodiment of the invention, the memory has a test flip-flop circuit that is initially set at zero. Following the third programming cycle, the control circuit reads said test cell and applies the result of said reading operation to the setting input of said test flip-flop circuit. Furthermore, the interface circuit communicates with said test flip-flop circuit to give a test signal that represents the state of said test flip-flop circuit.

This arrangement enables checks to be made on the quality of all the programming operations carried out since the memory was last powered on. This is particularly advantageous in environments with high electrical noise, such as a vehicular or factory environment.

In general, the memories are organized in words of fixed size associated with corresponding addresses. Thus, to enable a more precise analysis of the programming defects, and according to one alternative embodiment of the invention, the memory has one test cell per block of words, a block of words being constituted by words that have a determined number of common address bits. In response to a command for the writing of a word of one of said blocks in the memory, the control circuit selects one of said test cells as a function of said common address bits associated with the block and applies said first and third programming cycles to said selected test cell.

According to yet another possibility, it is possible to provide for one test cell per addressable word.

A further alternate embodiment provides a method of monitoring write operations in an EEPROM memory, comprising the following steps:

a.) Providing a plurality of memory cells connected to be programmed, with the memory cells are organized into one or more sets of memory cells, each set of memory cells having a test cell associated therewith.

b.) Performing all write commands to the of memory cells by means of three consecutive programming cycles:

1.) during the first programming cycle a first value, such as 0, is written to one of the test cells;

2.) during the second programming cycle a data value is written to a memory cell which is associated with the test cell just written, 3.) during the third programming cycle a second value, such as 1, is written to the test cell of step 1.

c.) Checking said test cells to determine their value, wherein if a respective one of said test cells has a value equal to said first value, the write operations performed to said respective set of memory cells associated with said test cell are regarded as invalid.

Using this method, there may be only one test cell associated with all of the memory cells, or there may be multiple test cells, with each test cell being associated with a group of memory cell, e.g. 16 memory cells for each test cell. The test cell(s) may be checked periodically, e.g. after each write operation, or the test may be done only after an external signal.

Yet another embodiment comprises a method of writing to a plurality of memory cells, comprising, for each request to write a data value to a memory cell, the steps of:

a.) writing a first value, such as 0, to a nonvolatile test cell associated with the desired memory cell;

b.) writing the data value to the memory cell; and c.) writing a second value, such as 1, to the test cell of step a).

Again, this method may be set up to use only one test cell, or each test cell may be associated with a fixed number of memory cells, e.g. 16 memory cells per test cell. If desired, a subsequent step may be added, to check the state of the test cell, and branch to an error-handling routine if the test cell is found to have the first value.

BRIEF DESCRIPTION OF THE DRAWING

The disclosed inventions will be described with reference to the accompanying drawings, which show important sample embodiments of the invention and which are incorporated in the specification hereof by reference, wherein:

The problem of ascertaining that data elements have been written properly has already arisen for volatile memories. In one standard approach, after each writing operation, the written data elements are re-read and compared with the data elements that should have been written. Another approach consists of the association, with the data elements to be written, of redundant data elements such as parity bits or an error to detection and correction code. These methods are quite valid for volatile memories since the logic states of the memory cells show no ambiguity whatsoever. However, in the case of the EEPROM type memories, situations may occur where the programming has been done in an incomplete way. Thus, a re-reading after programming might lead to the conclusion that the operation has been carried out properly even though there is a risk that the data elements might get erased in the course of time.

Other aspects and variants of the invention shall appear hereinafter in the description which is made with reference to the following figures.

Figure 1:
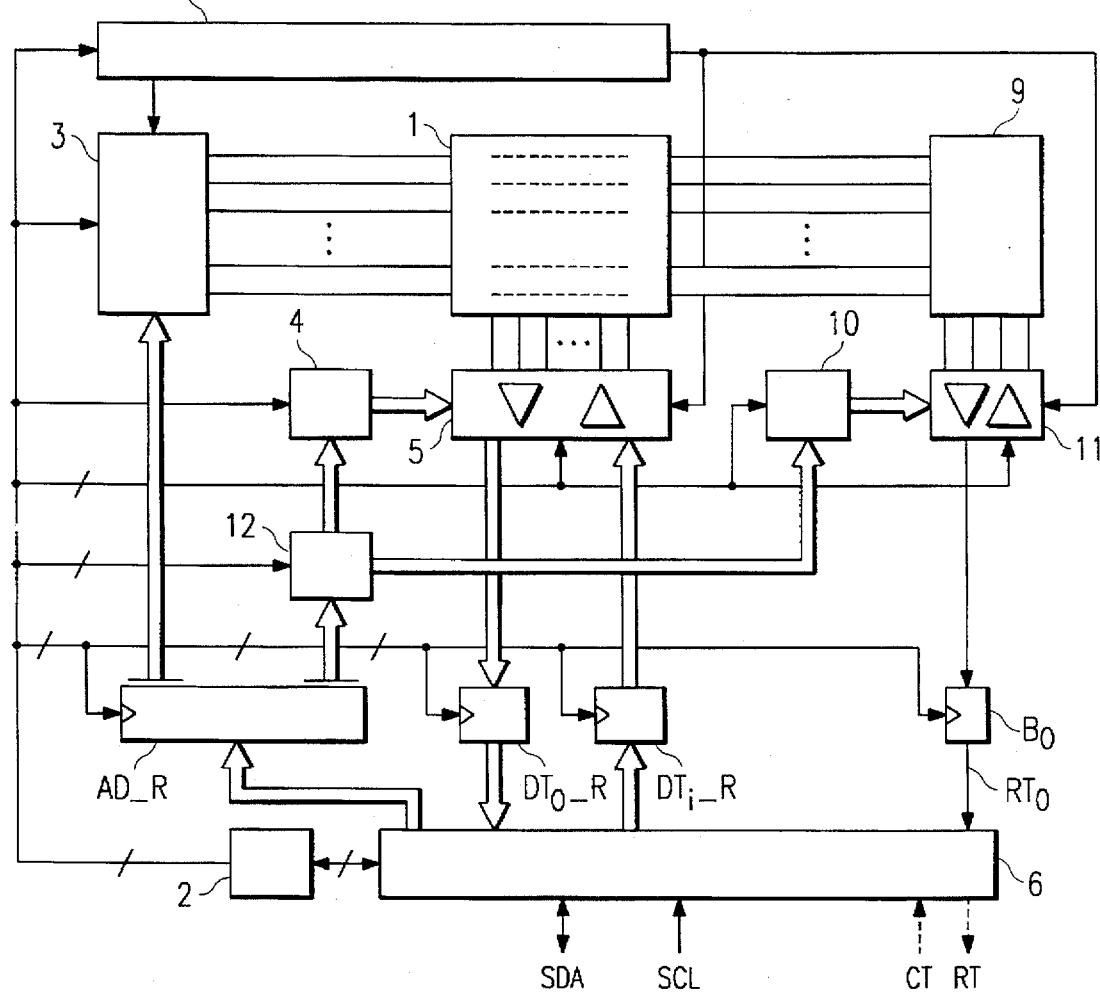

FIG. 1 shows an exemplary embodiment of a memory according to the invention.

Figure 2:
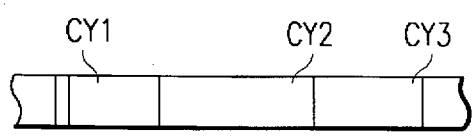

FIG. 2 gives a schematic view of the programming cycles carried out by the memory according to the invention.

Figure 3:
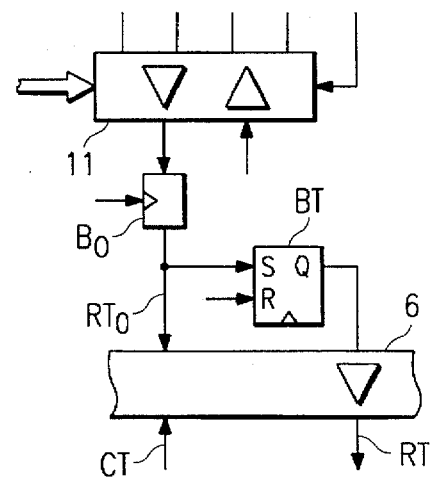

FIG. 3 shows a detail of an alternative embodiment.

DETAILED DESCRIPTION OF THE PREFERRED EMBODIMENTS

The numerous innovative teachings of the present application will be described with particular reference to the presently preferred embodiment (by way of example, and not of limitation), in which:

FIG. 1 exemplifies a structure of an EEPROM that has been adapted in order to implement the invention.

The memory has a matrix of memory cells connected to a row decoder 3 and a column decoder 4 associated with read and write circuits 5. The matrix 1 is written by means of a programming circuit 7 that is essentially constituted by an oscillator, a voltage—pull up circuit, and a programmed ramp generator. The decoders 3 and 4 are connected to an address register AD-R. The read and write circuits 5 are connected respectively to an output data register DTo-R and an input data register DTi-R. The registers AD-R, DTo-R, DTi-R communicate with an interface circuit 6. In the example shown, the circuit 6 is connected to a bus according to the I$^2$C standard that comprises notably a clock line SCL and a two-way line SDA that can be used to convey the addresses, the data elements and the commands. This entire unit is controlled by a control circuit 2. The circuit 2 will be made, for example, by means of a programmable logic array (PLA) designed to give the command signals to the different circuits as a function of the commands received from the line SDA, for example the read command RD or the write command WR.

The elements described up till now are those belonging to a standard type of memory such as the model ST24C04 memory marketed by the firm SGS-Thomson Microelectronics.

In order to implement the invention, the structure is complemented by a second matrix 9 of memory cells that contains the test cells. The matrix 9 is connected to the row decoder 3 and to a second column decoder 10 associated with a second set of read and write circuits 11. The column decoders 4 and 10 are connected to the address register AD-R by means of a selection circuit 12. The circuits 10, 11 and 12 are controlled by the control circuit 2. The read and write circuit 11 is connected to an output flip-flop circuit B0 that communicates with the interface circuit 6.

The number of test cells associated with each row of the matrix 9 will depend on the precision desired for the checking operation. If there is one test cell planned for each addressable word in the memory, then one row of the matrix 9 will contain as many test cells as there are words possessed by a row of the matrix 1. In this case, the decoders 4 and 10 will receive the same number of address bits, namely the column address corresponding to the least significant bits of the address register AD-R.

According to another possibility, it is possible to provide for one test cell per block of words. For example, if a row of the matrix 1 has sixteen words and if it is desired to have one test cell per four-word block, the matrix 9 will contain four test cells per row. Thus, the decoder 4 will be addressed by the column address formed by the last four bits of the address and the decoder 10 will be addressed only by the two most significant bits of the column address. Naturally, bits other than the most significant bits of the address could be used to identify the blocks of words.

In its simplest version, the invention could use only one test cell. This would naturally make the presence of a specific decoder unnecessary.

Before the working of the circuit of FIG. 1 is described, it may be recalled that the interface circuit 6 has the function, in reception mode, of decoding the commands received from the line SDA and of transmitting them to the control circuit 2. The interface circuit 6 also carries out the series—parallel conversion of the addresses and of the data elements received before transmitting them respectively to the address register AD-R and the input data register DTi-R. In transmission mode, under the control of the control circuit 2, the interface circuit 6 carries out the parallel-series conversion of the data elements sent out by the memory. These data elements may be the read data elements contained in the output data register DTo-R or in the output flip-flop circuit B0 or again control information elements stipulated by the communications protocol of the bus used.

As in the case of a standard memory, a writing operation is activated by a write command received by the interface 6. The command is acted upon by the control circuit 2 which activates the programming circuit 7, the row and column decoders 3, 4 and the address register AD-R and input data register DTi-R. In the case of a standard memory, the programming circuit carries out a programming cycle that consists of the application of a voltage pulse calibrated in terms of level and duration. This pulse is used to charge or discharge the floating gates of the transistors selected by the decoders as a function of the address received.

In the case of the invention, a write operation implies the performance of three successive programming cycles as shown schematically in FIG. 2. The first cycle CY1 consists in programming a test cell selected in the matrix 9 by the row decoder 3 as a function of the row address (most significant bits of the address) and by the column decoder 10 as a function of the column address (least significant bits of the address). This first cycle is aimed at programming the transistor of the selected cell at a first determined logic value corresponding, for example, to the conductive state of the transistor which, by convention, defines the logic value 1. The cycle CY1 is then followed by a second programming cycle CY2 that carries out the writing, in the matrix 1, of the data contained in the input data register DTi-R at the address contained in the address register AD-R. The second cycle could actually consist of two successive cycles: a first cycle to reset the address word at zero and a second cycle to set the selected cell at one. The cycle CY2 is then followed by a third programming cycle CY3 to reset the selected test cell at zero.

The operations for reading data elements contained in the matrix 1 are done in a standard way. By contrast, the reading of the test cells calls for a special command that can be applied, for example, to an additional input terminal of the interface 6 or included in the communications protocol of the bus. This test command CT must be accompanied by the sending of an address that enables the decoder 10 to select the test cell associated with this address. The state of the selected cell is transferred into the output flip-flop circuit B0 which is itself connected to the interface 6. The state of the flip-flop circuit B0 may be directly available at an output terminal of the interface 6 in the form of a test signal RT.

According to an alternative embodiment shown in FIG. 3, it is possible to provide for a test flip-flop circuit BT that is initially set at zero, having its setting input S connected to the output flip-flop B0. The state of the test flip-flop circuit BT may then be used to give a second test signal RT that is accessible at an output terminal of the interface 6. According to this variant, the control circuit 2 is designed for the automatic performance, after the third programming cycle CY3, of a command to read the test cell concerned. If the system is designed so that test flip-flop circuit BT will be set at zero whenever the memory is powered on, the state of the test flip-flop BT and, consequently, the signal RT will represent the quality of all the programming operations carried out since the last time that the memory was powered on. According to another possibility, the initial setting at zero may be activated by the control circuit 2 in response to an external control. This alternative method may be applied irrespectively of the organization of the memory and number of test cells.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For example, the invention is not only applicable to memories, but can also be used for erasably programmable logic, such as EEPALs or microprocessors with on-board EEPROM.

For another example, the test cell provides a capability which can be used (or not) by external software; but in an alternative embodiment, a smart memory (or programmable logic) can incorporate Power-On-Self-Test and/or Power-On-Reset routines which check the state of the test cells.

When an error is detected, the externally operating software (or smart logic on the chip) can, for example, erase all data from the corrupted cells, or can simply flag them as invalid.

What is claimed is:

1. A method of monitoring write operations in an EEPROM memory, comprising the steps of:
   a.) providing a plurality of memory cells connected to be programmed, wherein said plurality of memory cells are organized into one or more sets of memory cells, each set of memory cells having a test cell associated therewith;
   b.) performing all write commands to said plurality of memory cells by means of first, second and third programming cycles, wherein
      i.) during said first programming cycle a first value is written to a respective one of said test cells,
      ii.) during said second programming cycle a data value is written to a respective memory cell which is associated with said respective test cell,
      iii.) during said third programming cycle a second value is written to said respective test cell, said second value being different from said first value; and
   c.) checking said test cells to determine their value, wherein if a respective one of said test cells has a value equal to said first value, the write operations performed to said respective set of memory cells associated with said test cell are regarded as invalid.

2. A method as in claim 1, wherein the number of sets of memory cells is one.

3. A method as in claim 1, wherein each said set of memory cells includes only sixteen cells.

4. A method as in claim 1, wherein each series of read operations checks at least one of said test cells to ascertain the state thereof.

5. A method of writing to a plurality of memory cells, comprising, for each request to write a data value to a memory cell, the steps of:
   a.) writing a first value to a nonvolatile test cell associated with said memory cell;
   b.) after the completion of step a.), writing said data value to said memory cell; and
   c.) after the completion of step b.), writing a second value to said test cell associated with said memory cell.

6. A method as in claim 5, wherein all of the memory cells are associated with one test cell.

7. A method as in claim 5, wherein groups of 16 of said memory cells are associated with each test cell.

8. A method as in claim 5, further comprising the subsequent step, after said step c.), of checking the state of said test cell, and branching to an error-handling routine if said test cell is found to have said first value.

9. An electrically modifiable non-volatile memory comprising a set of memory cells, means for addressing and programming of said cells and an interface circuit, the memory being controlled by a control circuit, wherein said memory comprises at least one additional memory cell hereinafter called a test cell, said control circuit comprises means for selective activation of programming of said test cell and, in response to any write command received by said interface circuit, the control circuit activates three successive programming cycles:

a first cycle for programming of said test cell to write a first determined binary logic value;

after the completion of said first cycle, a second cycle for programming of data elements to be written; and after the completion of said second cycle, a third cycle for programming of said test cell to write a second logic value that is complementary to the first one.

10. A memory according to claim 9, comprising only one test cell.

11. A memory according to claim 10, wherein said interface circuit communicates with said test cell to give a first test signal representing the state of said test cell.

12. A memory according to claim 11, comprising a test flip-flop circuit that is initially set at zero wherein, following said third programming cycle, the control circuit reads said test cell and applies the result of said reading to the setting input of said test flip-flop circuit, and wherein the interface circuit communicates with said test flip-flop circuit to give a second test signal that represents the state of said test flip-flop circuit.

13. A memory according to claim 9, organized in words of fixed size associated with corresponding addresses and comprising one test cell per block of words, a block of words having a determined number of common address bits wherein, in response to a command for the writing of a word of one of said blocks in the memory, the control circuit selects one of said test cells as a function of said common address bits and applies said first and third programming cycles to said selected test cell.

14. A memory according to claim 13, wherein said interface circuit is designed to receive an external test control signal and wherein, in response to a read command and to a test command signal, the control circuit carries out the reading of the test cell addressed by the most significant bits of the address associated with said read command to give a first test signal representing the state of said test cell.

15. A memory according to claim 9, organized in words of fixed size associated with corresponding addresses and comprising one test cell per word wherein, in response to a command for the writing of a word, the control circuit selects one of said test cells as a function of the address of said word and applies said first and third programming cycles to said selected test cell.

16. A memory according to claim 15, wherein said interface circuit is designed to receive an external test control signal and wherein, in response to a read command and to said test control signal, the control circuit carries out the reading of the test cell selected by the address associated with said read command to give a first test signal representing the state of said test cell.

17. A memory according to claim 13, comprising a test flip-flop circuit that is initially set at zero wherein, following said third programming cycle, the control circuit reads said selected test cell and applies the result of said reading to the setting input of said test flip-flop circuit, and wherein said interface circuit communicates with said test flip-flop circuit to give a first test signal that represents the state of said test flip-flop circuit.

18. A memory according to claim 14, comprising a test flip-flop circuit that is initially set at zero wherein, following said third programming cycle, the control circuit reads said selected test cell and applies the result of said reading to the setting input of said test flip-flop circuit, and wherein said interface circuit communicates with said test flip-flop circuit to give a second test signal that represents the state of said test flip-flop circuit.

19. A memory according to claim 15, comprising a test flip-flop circuit that is initially set at zero wherein, following said third programming cycle, the control circuit reads said selected test cell and applies the result of said reading to the setting input of said test flip-flop circuit, and wherein said interface circuit communicates with said test flip-flop circuit to give a first test signal that represents the state of said test flip-flop circuit.

20. A memory according to claim 16, comprising a test flip-flop circuit that is initially set at zero wherein, following said third programming cycle, the control circuit reads said selected test cell and applies the result of said reading to the setting input of said test flip-flop circuit, and wherein said interface circuit communicates with said test flip-flop circuit to give a second test signal that represents the state of said test flip-flop circuit.

* * * * *